United States Patent [19]

Katoh

[11] Patent Number: 5,157,357

[45] Date of Patent: Oct. 20, 1992

[54] MONOLITHIC MICROWAVE IC OSCILLATOR

[75] Inventor: Takayuki Katoh, Itami, Japan

[73] Assignee: Mitsubishi Denki Kabushiki Kaisha, Japan

[21] Appl. No.: 735,952

[22] Filed: Jul. 25, 1991

[30] Foreign Application Priority Data

Feb. 7, 1991 [JP] Japan .................... 3-39521

[51] Int. Cl.$^5$ .............................................. H03B 5/18
[52] U.S. Cl. ........................ 331/74; 331/77; 331/96; 331/117 FE; 331/117 D; 331/177 V
[58] Field of Search ........ 331/96, 99, 108 C, 117 FE, 331/117 D, 117 R, 177 V, 74, 77; 332/102, 130

[56] References Cited

U.S. PATENT DOCUMENTS

| | | | |
|---|---|---|---|
| 4,075,580 | 2/1978 | Sunkler | 331/96 |
| 4,189,690 | 2/1980 | Bock et al. | 332/130 |
| 4,310,809 | 1/1982 | Buck et al. | 331/117 D |
| 4,458,215 | 7/1984 | Huang et al. | 331/117 D |
| 4,670,722 | 6/1987 | Rauscher | 331/117 FE |
| 4,868,526 | 9/1989 | Camiade et al. | 331/117 FE |

FOREIGN PATENT DOCUMENTS

| | | |
|---|---|---|
| 1764827 | 11/1971 | Fed. Rep. of Germany . |
| 2335998 | 12/1976 | France . |
| 57-68055 | 8/1982 | Japan . |
| 60-224310 | 3/1986 | Japan . |
| 222925 | 3/1990 | Japan . |
| 2183606 | 9/1990 | Japan . |
| 1570502 | 11/1976 | United Kingdom . |

Primary Examiner—David Mis
Attorney, Agent, or Firm—Leydig, Voit & Mayer

[57] ABSTRACT

A monolithic microwave IC oscillator includes a feedback amplifier having a field effect transistor and a varactor diode. The varactor diode has a junction capacitance that varies according to the bias voltage applied to said diode and capacitively couples the amplifier to an external load. Any variation of the capacitance of the load-coupling capacitor caused by design errors or by variations in the manufacturing process can be easily corrected when the device is used. As a consequence, the oscillator can always be operated with good oscillaitng characteristics without hindering integration of individual components and without increasing costs.

15 Claims, 8 Drawing Sheets

MONOLITHIC MICROWAVE IC OSCILLATOR

FIELD OF THE INVENTION

The present invention relates to a microwave oscillator manufactured as a monolithic microwave IC and, more particularly, to a capacitor included in such a microwave oscillator, for capacitively coupling a feedback amplifier device providing feedback amplification of microwave signals to an external load.

BACKGROUND OF THE INVENTION

Figure 8:
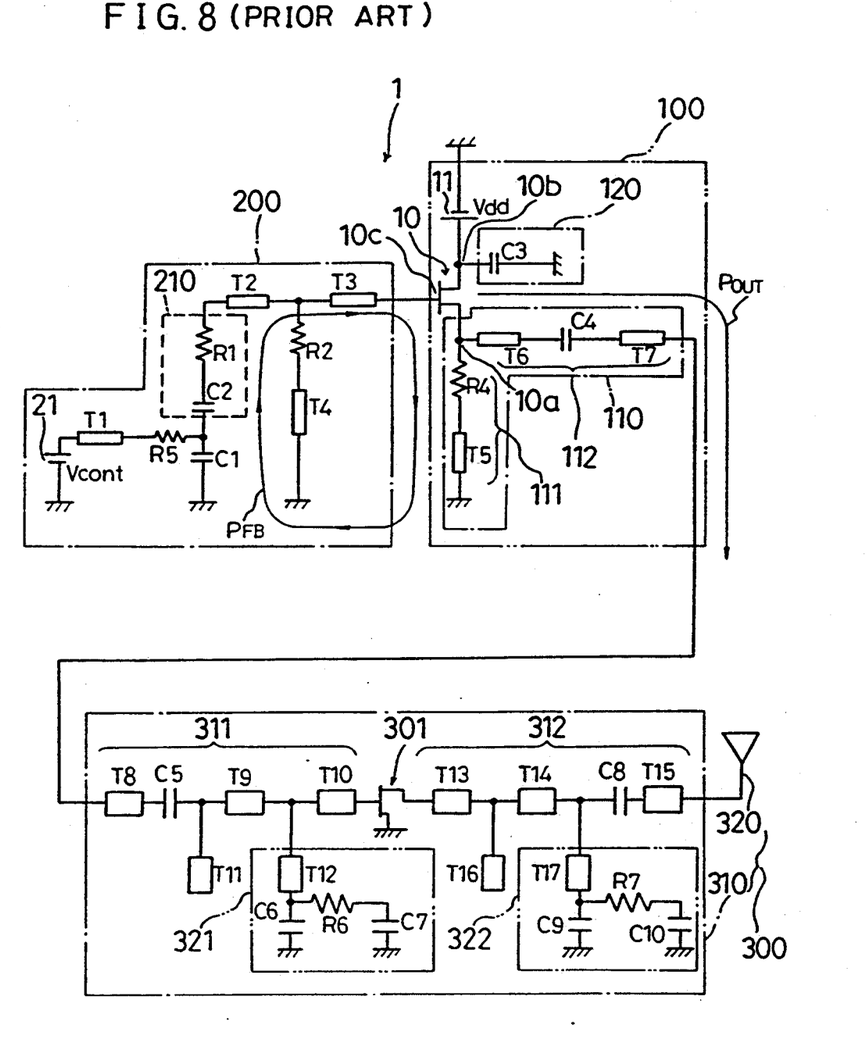
FIG. 8 is an equivalent circuit diagram of the prior art MMIC oscillator.

FIG. 8 shows an equivalent circuit of a prior art microwave oscillator manufactured as a monolithic microwave IC substrate (not shown). This oscillator is hereinafter referred to as an MMIC oscillator. This MMIC oscillator is generally indicated by numeral 1. The oscillation frequency of the oscillator 1 can be controlled by controlling its input voltage. The oscillator 1 comprises a signal amplifying portion 100 amplifying microwave signals and supplying a part of the output signal from the amplifying portion 100 as oscillation output to an external load 300, and a reactance control portion 200 which controls the output frequency of the amplifying portion 100 by varying the reactance component of the reactance control portion 200.

In the signal amplifying portion 100, a feedback amplifier element 10 provides feedback amplification of microwave signals. In this design, a GaAs MESFET is used as the amplifier element 10. This FET is hereinafter referred to as the feedback amplifier FET. A load-coupling portion 110 capacitively couples the feedback amplifier FET 10 to the external load 300, and comprises a source bias portion 111 applying a given bias potential to the source 10a of the FET 10 and a signal output portion 112 from which the source output is supplied to the external load. The source bias portion 111 is composed of a bias resistor R4 and a transmission line T5 which are connected in series between the source 10a and ground. The signal output portion 112 comprises a transmission line T6, a load-coupling capacitor C4, and another transmission line T7 which are connected in this order in the line going from the source terminal 10a to the external load. A capacitor C3 grounds the drain 10b of the feedback amplifier FET 10 at microwave frequencies and forms a grounding portion 120. A constant voltage source 11 applies a DC voltage $V_{dd}$ to the drain 10b.

The reactance control portion 200 includes a diode 210, shown as its equivalent circuit elements, inserted between the gate 10c of the feedback amplifier FET 10 and ground biased in the reverse direction such that its capacitive component C2 can be varied. The diode 210 has an internal resistance R1. Transmission lines T2 and T3 are connected in series between the gate 10c and the anode of the diode 210. A capacitor C1 is inserted between the cathode of the diode 210 and ground. The form a feedback path $P_{FB}$ for the source output between ground and the gate 10c of the feedback amplifier FET 10. A voltage source 21 produces a DC voltage $V_{cont}$ to control the capacitive component C2 of the diode 210 and the oscillation frequency. The voltage source 21 is connected to the cathode of the diode 210 through a transmission line T1. Another transmission line T4 is connected between ground and the junction of the transmission lines T2 and T3 to match the signal waveforms in the feedback path $P_{FB}$. Resistors R2 and R5 prevent microwave signals from leaking out of the feedback path $P_{FB}$.

The aforementioned external load 300 consists of a one-stage high-output amplifier 310 amplifying the oscillation output and an antenna 320 radiating the output from this amplifier 310 in the form of electromagnetic waves. The amplifier 310 comprises a signal amplifying FET 301. A transmission circuit 311 on the input side introduces the oscillation output to the gate of the FET 301. Transmission lines T8-T11 on the input side provide impedance matching. A capacitor C5 block DC components. A transmission line T12, capacitors C6 and C7, and a resistor R6 together form a gate bias circuit for the amplifying FET 301. A transmission circuit 312 on the output side guides the output from the drain of the FET 301 into the antenna 320. Transmission lines T13-T16 on the output side provide impedance matching. A capacitor C8 blocks DC components. A transmission line T17, capacitors C9 and C10, and a resistor R7 together form a drain bias circuit. All of these devices and transmission lines are monolithically manufactured as a monolithic microwave IC (hereinafter, referred to as an MMIC).

In the operation of this MMIC oscillator 1, when the voltage $V_{dd}$ (normally about 3 to 10 v) from the constant voltage source 11 is applied to the feedback amplifier FET 10, the input to the gate is amplified by the FET 10 and fed to the source 10a. The source output is applied to the gate. In this way, the signal is fed back and amplified. At this time, the microwave signal is fed back through the feedback path $P_{FB}$ and amplified. At the same time, a portion of the fed back and amplified output is supplied as the oscillation output to the external load 300 via a signal output path $P_{OUT}$. In the external load 300, the oscillation output is amplified by the one-stage high-output amplifier 310. The output of this amplifier 310 is radiated as electromagnetic waves by the antenna 320.

When the oscillator oscillates in this way, if the voltage of the variable voltage source 21 of the reactance control portion 200 is varied, then the capacitive component C2 of the diode 210 varies, i.e., the reactance of the reactance control portion 200 changes. As a result, the frequency of the oscillation output is varied. In this manner, the frequency of this MMIC oscillator 1 is varied by altering the DC control voltage $V_{cont}$.

Japanese Published Patent Application 60-224310 discloses an MMIC oscillator which controls the oscillation frequency by applying a control voltage to a varactor diode.

This prior art MMIC oscillator uses a metal-insulator-metal capacitor (hereinafter, referred to as MIM capacitor) as the load-coupling capacitor C4 of the load-coupling portion 110, it being noted that the MIM capacitor can form a large capacitive element. Therefore, the capacitance of the load-coupling capacitor C4 varies greatly among commercial product.

Figure 9:
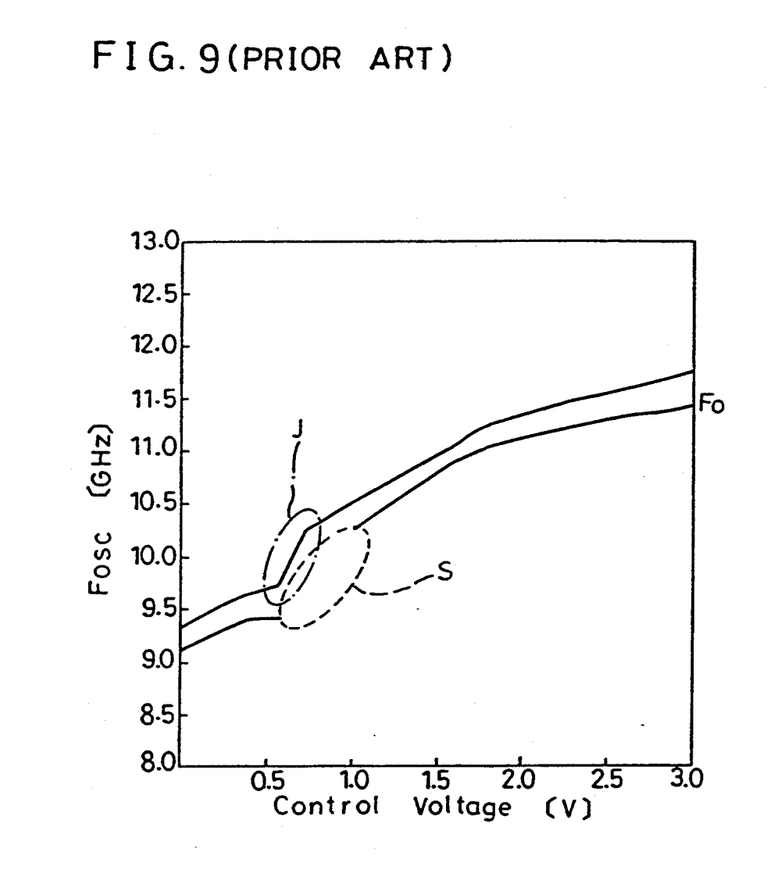
FIG. 9 is a graph showing oscillating characteristics of the prior art microwave IC oscillator shown in FIG. 8.

Specifically, it is generally difficult to obtain the previously calculated capacitance value from a capacitor such as an MIM capacitor. In the MIM capacitor, the interlayer insulating film is formed on the lower metallization layer, and the upper metallization layer is deposited on the insulating film. Since the capacitance value is in inverse proportion to the thickness of the interlayer insulating film, if the film thickness varies during the manufacturing process because of temperature variations occurring during the film formation or because of variations of the composition of the gas in the raw material gas supply source, then the capacitance also varies. As an example, when the load-coupling capacitance is too large an, oscillation output cannot be obtained in a voltage region of the variable voltage source 21 (oscillation halting region S shown in FIG. 9) or the oscillation frequency $F_{OSC}$ tends to change abruptly in a region of the control voltage (frequency jumping phenomenon J shown in FIG. 9). Conversely, when the load-coupling capacitance becomes too small, a decrease in the oscillation output often takes place.

To overcome these problems, a reference MMIC oscillator and several preliminary MMIC oscillators have been heretofore designed. In particular, the reference oscillator includes the MIM capacitor C4 acting as the load-coupling capacitor, and the capacitance of this capacitor C4 is set to a desired value. The values of the capacitors C4 of the preliminary oscillators ar set to different values deviating from the desired value within a range of about + 5%. After these oscillators are actually manufactured, the oscillation characteristics or the like are measured. Then, the MMI oscillator which exhibits the best characteristics is selected and mass-produced. In this method, the designing step prior to the mass production needs much labor. Also, this method is uneconomical to perform.

Published Patent Application 2-183606 discloses a feedback type MIC (Microwave Integrated Circuit) oscillator having a first transmission line forming a feedback amplifier circuit and a second transmission line for the output. A multi-land capacitor is disposed between the first and second transmission lines to facilitate optimizing the impedance at the junction of the two transmission lines. It may be thought that this multi-land capacitor disclosed in the aforementioned Japanese patent specification can be used a the load-coupling capacitor described above.

However, no specific structure of the multi-land capacitor is disclosed in the patent specification, and it is difficult to use the multi-land capacitor as the above-described load-coupling capacitor. Also, it is considered that fabricating the capacitor in the form of multiple lands is realized by preparing several capacitors and then the appropriate one out of the prepared capacitors. That is, this method involves preparing several capacitors having large capacitances which are necessary for the proper function. This is disadvantageous for integration and efficient utilization of the devices and does not meet the present demands for lower cost and larger-scale integration.

SUMMARY OF THE INVENTION

It is an object of the invention to provide an MMIC oscillator having a capacitor whose capacitance can be easily modified when the device is in use if the capacitance deviates from the intended value because of design errors or because of variations of the conditions of the manufacturing process, whereby the MMIC oscillator can be operated with good oscillating characteristics without hindering integration of individual components and without increasing costs.

The above object is achieved by an MMIC oscillator having a varactor diode the junction capacitance of which is varied in response to the bias voltage applied to it and which couples a feedback amplifier element providing feedback amplification of microwave signals to an external load through the variable junction capacitance. The capacitance value of the coupling varactor diode can be varied by adjusting the bias voltage. The variation of the capacitance caused by design errors or by variations of the conditions of the manufacturing process can be easily corrected when the device is in use. Consequently, the MMIC oscillator can be operated with good oscillating characteristics at all times without hindering integration of individual components and without increasing costs.

In one embodiment of the invention, the capacitor which couples the feedback amplifier element providing feedback amplification of microwave signals to the external load is manufactured on an MMIC substrate and comprises a main coupling capacitor capacitively coupling the feedback amplifier element to the external load and auxiliary coupling capacitors disposed close to the main coupling capacitor on the MMIC substrate and connected with the main coupling capacitor to adjust the capacitance value of the main coupling capacitor. The auxiliary capacitors are connected with the main capacitor in parallel, for example, by wire bonding. Thus, the variation of the capacitance caused by design errors or because of the variations of the conditions of the manufacturing process can be easily corrected when the device is in use. Consequently, the MMIC oscillator can be operated with good oscillating characteristics at all times without hindering integration of individual components or a reduction in the cost, in the same way as the foregoing.

Other objects and features of the invention will appear in the course of the description thereof which follows.

DETAILED DESCRIPTION OF THE INVENTION

Figure 1:
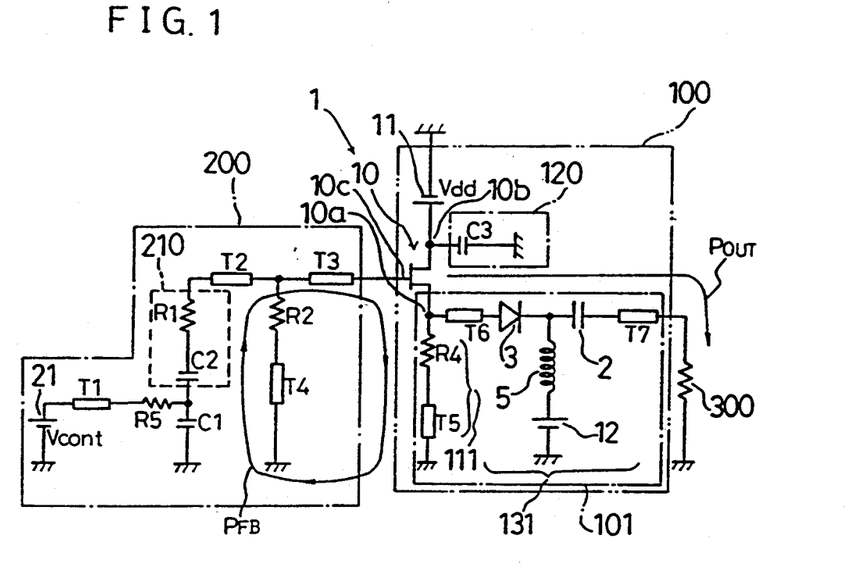
FIG. 1 is an equivalent circuit diagram of an MMIC oscillator according to the invention.

FIG. 1 is an equivalent circuit diagram of an MMIC oscillator according to the invention. It is to be noted that like components are indicated by like reference numerals in various figures including FIG. 8. This MMIC oscillator includes a varactor diode 3 whose capacitive component is varied according to the voltage applied to its cathode. This varactor diode 3 acts as a load-coupling capacitor and is inserted between transmission lines T6 and T7. A DC-blocking capacitor 2 is connected between the cathode of the varactor diode 3 and the transmission line T7. A control voltage source 12 produces a controllable voltage to the diode 3. An RF-blocking inductor 5 is connected between the cathode of the varactor diode 3 and the voltage source 12. The transmission lines T6, T7, the varactor diode 3, the DC-blocking capacitor 2, the RF-blocking inductor 5, and the voltage source 12 together form a signal output portion 131. A load-coupling portion 101 consists of the signal output portion 131 and a source bias portion 111. An external load similar to the external load 300 shown in FIG. 8 is shown diagrammatically in this figure.

Figure 12A:
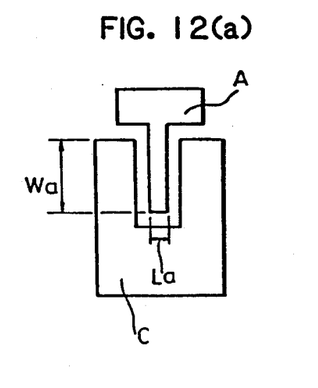
FIG. 12(a) is a side elevation of the varactor diode used in the MMIC oscillator shown in FIG. 1.
Figure 12B:
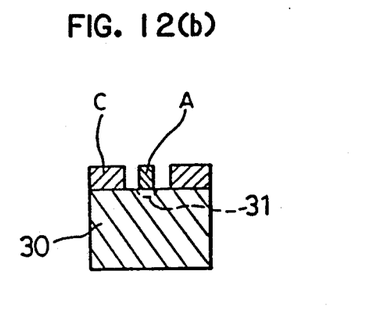
FIG. 12(b) is a cross-sectional view of the varactor diode used in the MMIC oscillator shown in FIG. 6.

Referring next to FIGS. 12(a) and 12(b), the structure of the above-described varactor diode 3 is shown. Indicated by numeral 30 is a GaAs MMIC substrate. A substantially U-shaped cathode electrode C is formed on the substrate 30. A T-shaped anode electrode A is formed on the substrate 30 and has a leg portion extending into the recess formed in the U-shaped cathode electrode C. A depletion layer 31 is formed in the substrate 30 immediately under the anode electrode A. The leg portion of the anode electrode A which is disposed in the recess inside the cathode electrode C has a length of Wa (anode width). The leg portion of the anode electrode A has a width, or pattern width, of La (anode length). To a first approximation, the capacitance of the varactor diode of this construction is in proportion to the product of the anode width Wa and the anode length La.

The operation of the novel MMIC oscillator is now described. Since the oscillation operation of this oscillator is essentially the same as the oscillation operation of the prior art MMIC oscillator, the oscillation operation is not described herein; only the oscillating characteristics, i.e., the adjustment of the oscillation frequency and the oscillation signal, are described below.

Figure 2:
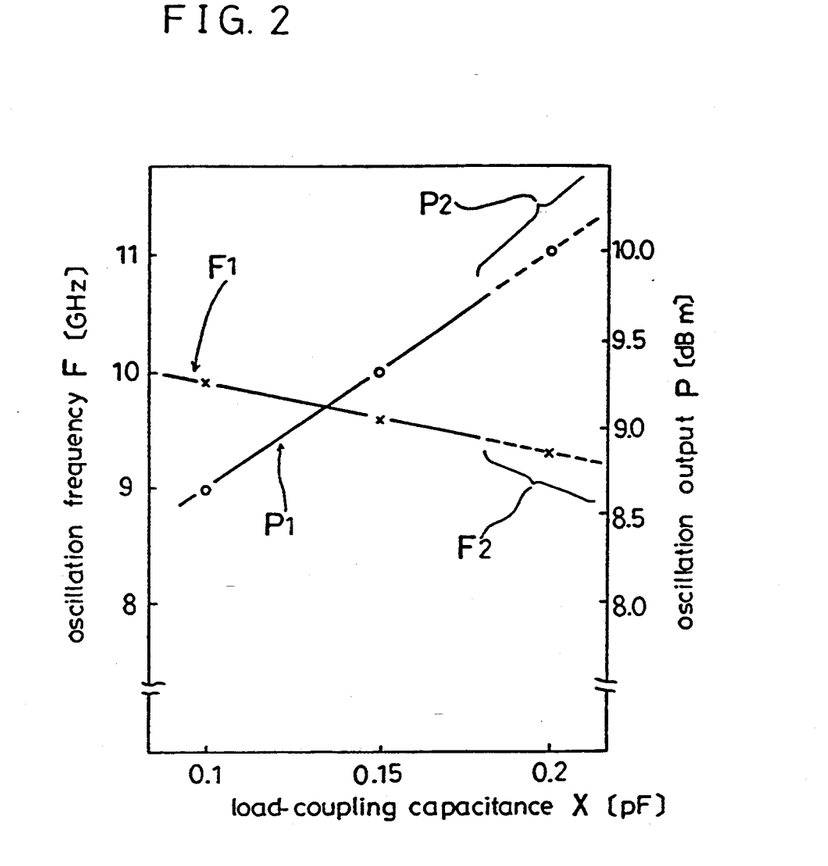
FIG. 2 is a graph in which the oscillation frequency and the oscillation output of the MMIC oscillator shown in FIG. 1 are plotted against the capacitance of the load-coupling capacitor.

FIG. 2 is a graph showing the dependence of the oscillation frequency and the oscillation output of the MMIC oscillator on the capacitance of the load-coupling capacitor within the X band, ranging from 7 GHz to 9 GHz. Indicated by F1 is a stable region of the oscillation frequency. Indicated by P1 is a stable region of the oscillation output. Indicated by F2 is an unstable region of the oscillation frequency. Indicated by P1 is an unstable region of the oscillation output.

In this example, the oscillation frequency and the oscillation output are unstable when the capacitance X of the load-coupling capacitor is in excess of about 0.18 pF. Since the oscillation output decreases with decreasing capacitance X, approximately 0.15 pF is the optimum value, taking a slight amount of variation into account.

This value of the capacitance X of the load-coupling capacitor can be realized by the varactor diode with an anode width Wa of about 500 μm. If the capacitance value deviates from the optimum value because of the design errors or by the effects of variations of the conditions occurring during the manufacturing process, then the control voltage applied to the varactor diode 3 is adjusted by means of the control voltage source 12, so that the optimum capacitance value can be accomplished at all times.

Figure 7:
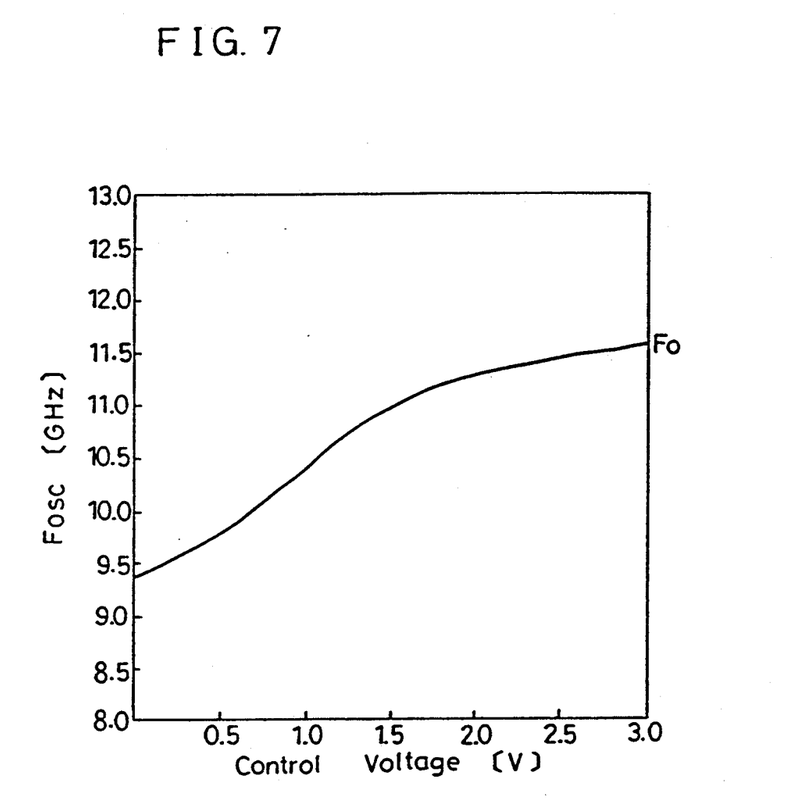
FIG. 7 is a graph showing one oscillating characteristic of an MMIC oscillator according to the invention.

Thus, in the present example, the capacitor for coupling the feedback amplifying FET 10 providing feedback amplification of microwave signals to the external load 300 includes of the varactor diode 3. The varactor diode 3 has a junction capacitance which is varied according to the bias voltage and couples the FET 10 to the external load 300 through the variable junction capacitance. Therefore, the capacitance value X of the capacitor coupling the load can be changed by adjusting the bias voltage. Hence, the variation of the capacitance of the load-coupling capacitor attributed to design errors or to variations of the conditions of the manufacturing process can be readily corrected when the device is in use. As a result, the oscillator can be operated always with the stable oscillating characteristics as shown in FIG. 7 without hindering integration of individual components and without increasing costs.

Figures 10A, 10C, 10E:
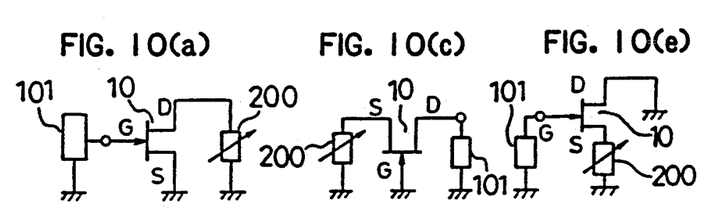
FIGS. 10(a) to 10(f) are circuit diagrams of modifications of the method by which the oscillation output signal is taken from the feedback amplifier element of an MMIC oscillator according to the invention.
Figures 10B, 10D:
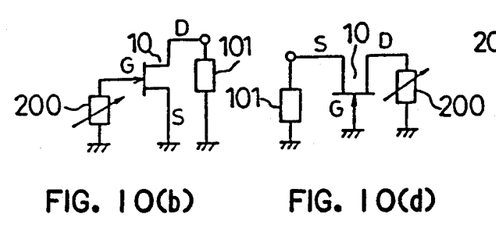

FIGS. 10(a) to 10(f) show various examples of interconnections between the feedback amplifying FET of the MMIC oscillator, the signal output portion, and the control portion, i.e., show from which terminal of the feedback amplifying the output is taken and what terminal is used as the control input terminal. FIG. 11 is a graph showing the modulation sensitivity characteristics of the examples shown in FIGS. 10(a) to 10(f). That is, this graph shows the variations of the oscillation frequency when the DC control voltage $V_{cont}$ is varied. In the graph of FIG. 11, the phase of the reflection coefficient of the variable reactance is a measure of the oscillation frequency F and is plotted on the horizontal axis, and the phase of the reflection coefficient of the FET as viewed from the load side is plotted on the vertical axis, the latter phase being a measure of the DC control voltage $V_{cont}$.

Figure 10F:
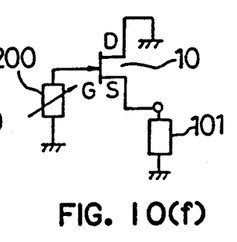
Figure 11:
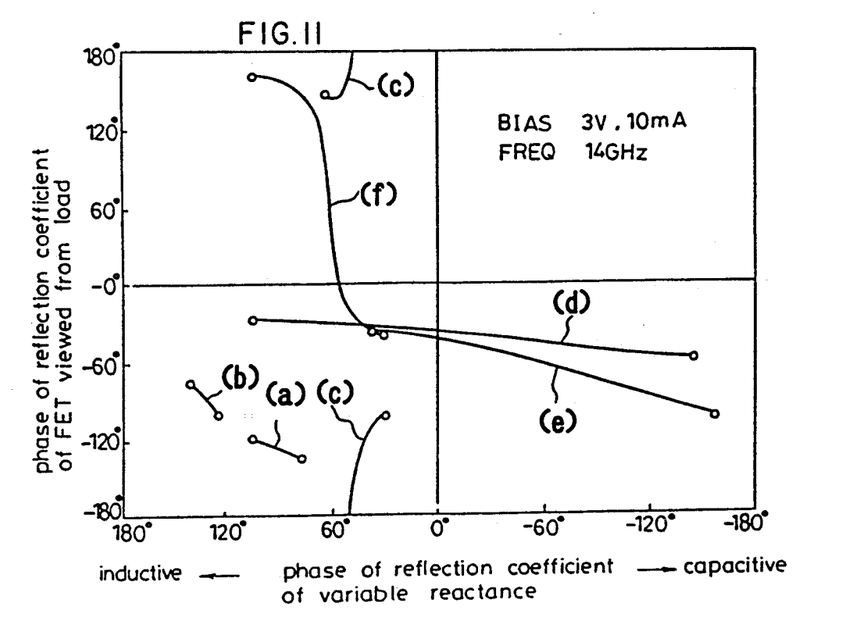
FIG. 11 is a graph showing the characteristic curves of the modulation sensitivities of the modifications illustrated in FIGS. 10(a) to 10(f)

In the present example of FIG. 1, as shown in FIG. 10(f), the drain of the FET 10 is grounded. The reactance control portion 200 is connected to the gate of the FET 10. The load-coupling portion 101 is connected with the source of the FET 10. Output is taken from this source. As indicated by the characteristic curve (f) of FIG. 11, the modulation sensitivity is large. Also, the output power can be made large.

Figure 3:
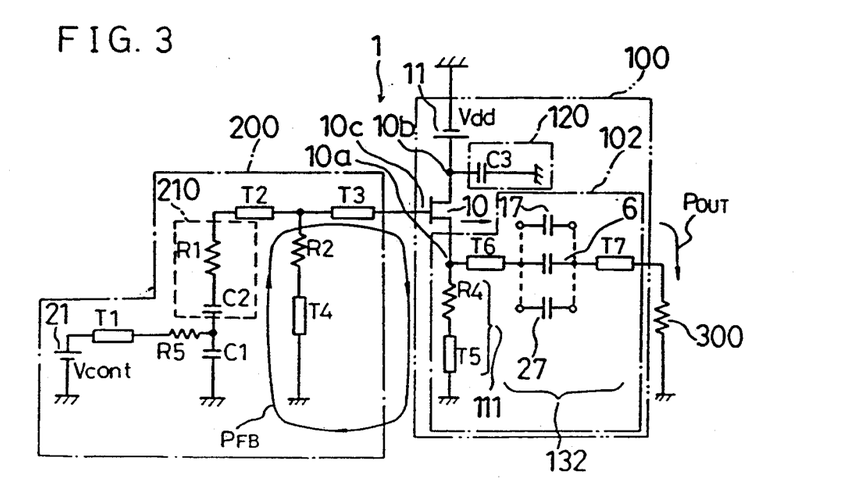
FIG. 3 is an equivalent circuit diagram of another MMIC oscillator according to the invention.

FIG. 3 is an equivalent circuit diagram of another MMIC oscillator according to the invention. This oscillator is similar to the MMIC oscillator described already in conjunction with FIG. 1 except for the following points. A main coupling capacitor 6 is connected between the transmission lines T6 and T7 of the load-coupling portion 101 and capacitively couples the feedback amplifying FET 10 to the external load 300. The capacitance value X of the capacitor 6 is set slightly smaller than the optimum value forecast at the stage of design. A first auxiliary coupling capacitor 17 and a second auxiliary coupling capacitor 27 are located close to the main capacitor 6 for connection in parallel with the main capacitor 6 by wire bonding or another method. These auxiliary capacitors are used to adjust the capacitance value X of the main capacitor 6. The main capacitor 6, the auxiliary capacitors 17, 27, the transmission lines T6, T7 together comprise a signal output portion 132. The signal output portion 132 and the source bias portion 111 together form a load-coupling portion 102.

Figure 4:
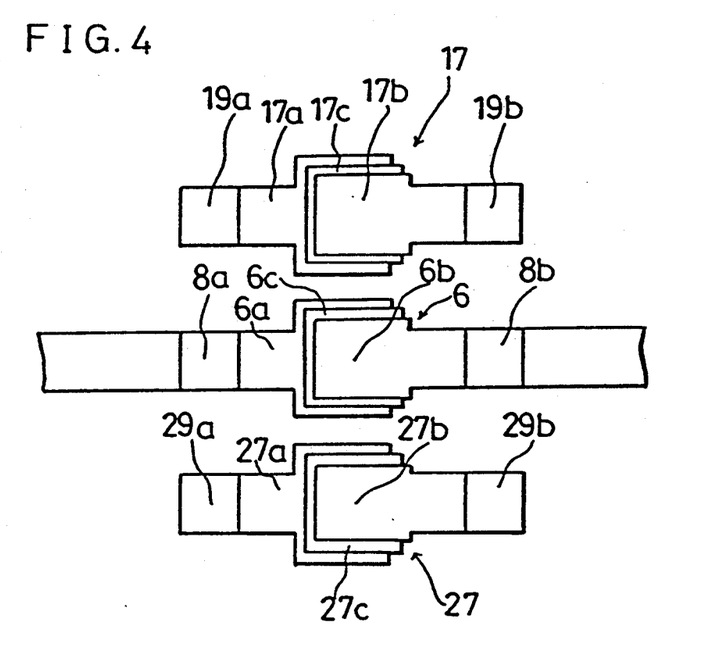
FIG. 4 is a plan view of the load-coupling capacitor of the MMIC oscillator shown in FIG. 3.

FIG. 4 is a plan view showing the load-coupling capacitor of the MMIC oscillator of FIG. 3. The main coupling capacitor and the first and second auxiliary coupling capacitors are disposed on the MMIC substrate (not shown). The main capacitor 6 is of a laminated structure comprising a lower electrode layer 6a, an interlayer insulating film 6c formed on the lower electrode layer 6a, and an upper electrode layer 6b formed on the insulating film 6c. This main capacitor 6 acting a the load-coupling capacitor has a large capacitance of $X_0$. Bonding pads 8a and 8b are formed on desired portions of the electrode layers 6a and 6b. The first auxiliary capacitor 17 includes of a lower electrode layer 17a, an interlayer insulating film 17c formed on the lower layer 17a, and an upper electrode layer 17b formed on the insulating film 17c. Similarly, the second auxiliary capacitor 27 includes of a lower electrode layer 27a, an interlayer insulating film 27c formed on the lower layer 27a, and an upper electrode layer 27b formed on the insulating film 27c. These auxiliary capacitors 17 and 27 have small values of capacitance $X_1$ and $X_2$, respectively, for adjusting the capacitance of the load-coupling capacitor. The first auxiliary capacitor 17 has bonding pads 19a and 19b. The second auxiliary capacitor 27 has bonding pads 29a and 29b.

Figure 5:
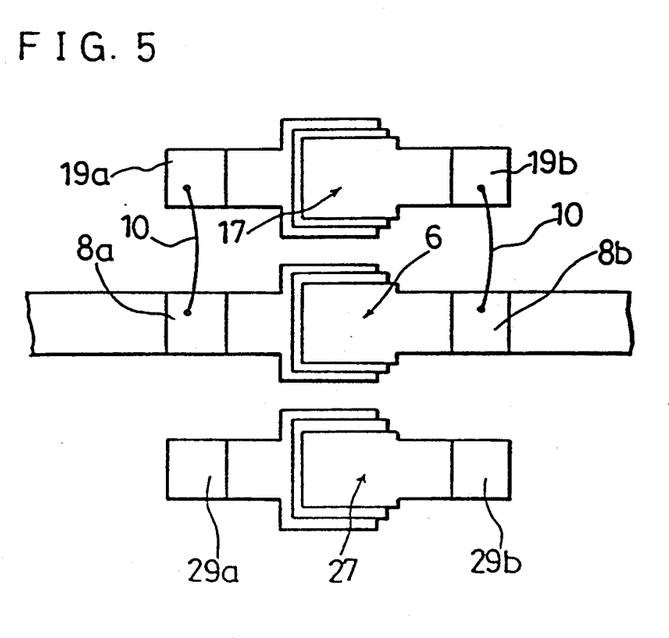
FIG. 5 is a view similar to FIG. 4, but showing the manner in which the capacitance value of the load-coupling capacitor is adjusted.

FIG. 5 is a plan view similar to FIG. 4, but in which the auxiliary coupling capacitors are connected with the main coupling capacitor by wire bonding to the capacitance value of the load-coupling capacitor. It is to be noted that the first and second auxiliary coupling capacitors 17, 27 are exaggerated compared with the main coupling capacitor 6 in FIGS. 4 and 5, though all of them seem to have the same size. In the actual device, the auxiliary capacitors occupy a considerably smaller area than does the main capacitor.

In this example, the capacitance value $X_0$ of the main coupling capacitor 6 which forms a reference is set less than the optimum value. The first and second auxiliary capacitors are appropriately connected with the main capacitor by wire bonding. In this way, the load-coupling capacitor is adjusted to exhibit the optimum capacitance value at all times.

More specifically, the capacitance value $X_0$ of the main coupling capacitor 6 which acts as the load-coupling capacitor is set slightly less than the optimum value forcasted at the stage of design. The first and second auxiliary coupling capacitors 17 and 27, respectively, are provided to adjust the capacitance value $X_0$. The auxiliary capacitors 17 and 27 are successively connected in parallel with the main capacitor 6 by wire bonding or another method. Therefore, the variation of the capacitance of the load-coupling capacitor caused by design errors or by variations of the conditions of the manufacturing process can be easily corrected when the device is in use.

Also in this example, the large capacitance value $X_0$ of the main coupling capacitor 6 is adjusted by the small capacitance values $X_1$ and $X_2$ of the first and second auxiliary coupling capacitors 17 and 27, respectively. Hence, the area of the load-coupling capacitor can be made smaller than in the case in which several main coupling capacitors are previously prepared and the capacitor having the optimum capacitance value is selected out of them.

Although the auxiliary capacitors are connected with the main capacitor by wire bonding, the interconnection of the capacitors is not limited to this method; rather any method may be utilized as long as the capacitors can be electrically interconnected.

In the examples described above, the DC Blocking capacitor 4 is disposed on the side of the load to the varactor diode. However, where the buffer amplifier 310 or the like having the DC Blocking capacitor 5 is located immediately behind the oscillator 1 as in the MMIC oscillator shown in FIG. 8, the capacitor 4 is dispensed with.

Figure 6:
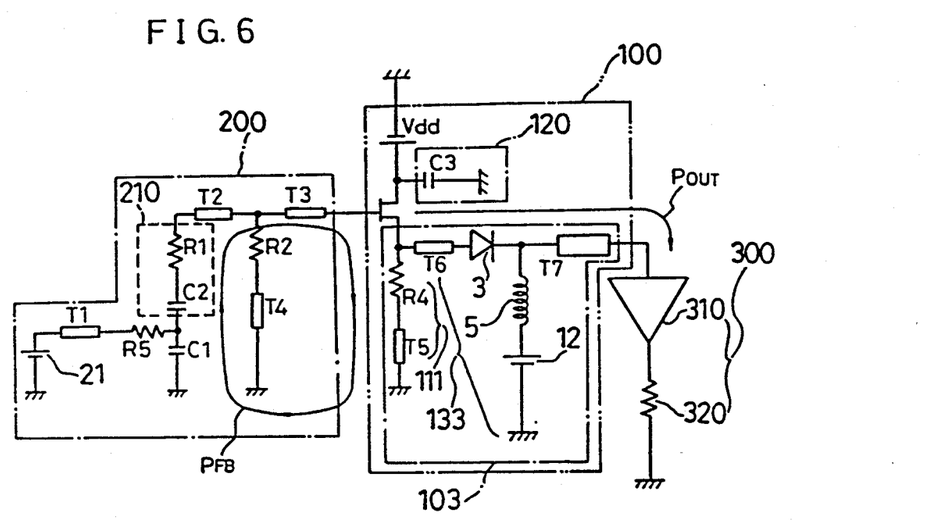
FIG. 6 is an equivalent circuit diagram of a further MMIC oscillator according to the invention.

Referring next to FIG. 6, there is shown a further MMIC oscillator according to the invention. This oscillator is similar to the oscillator already described in connection with FIG. 1 except for the following points. A buffer amplifier 310 is connected to the output of the MMIC oscillator 1 and incorporates a DC Blocking capacitor. A signal output portion 133 comprises the varactor diode 3, the RF Blocking inductor 5, the control voltage source 12, and the transmission lines T6 and T7. A load-coupling portion 103 comprises the signal output portion 133 and the source bias portion 111. That is, this example is similar to the example described first except that no DC Blocking capacitor is connected between the transmission line T7 and the varactor diode 3.

In the examples described above, the external load is either the amplifier 310 or the antenna 320. The load may also be a mixer or frequency converter. Also, the antenna may be replaced by an optical transmission system which converts an electrical signal into an optical signal and conveys it.

Also in the above examples, the oscillation output is taken from the source. As shown in FIG. 10(b), the load-coupling portion 101 may be connected with the drain, and oscillation output may be taken from this drain. The modulation sensitivity of this oscillator is indicated by the characteristic curve (b) of FIG. 11. Although this modulation sensitivity is not very high, a large output power can be derived.

As shown in FIG. 10(c), where the gate is grounded and the control portion 200 and the load-coupling portion 101 are connected with the source and the drain, respectively, a high modulation sensitivity can be obtained as can be seen from the characteristic curve (c) of FIG. 11.

As shown in FIG. 10(d), where the gate of the feedback amplifying FET 10 is grounded and the control portion 200 and the load-coupling portion 101 are connected with the drain and the source, respectively, the oscillator has the advantage that it is less affected by the load as indicated by characteristic curve (d) of FIG. 11. Similarly, as shown in FIG. 10(e), where the drain is grounded and the control portion 200 and the load-coupling portion 101 are connected with the source and the gate, respectively, the oscillator is less affected by the load as indicated by characteristic curve (e) of FIG. 11, but it is difficult to make the output power large.

The circuit configuration shown in FIG. 10(a) is also possible. In particular, the source is grounded. The control portion 200 and the load-coupling portion 101 are connected with the drain and the gate, respectively. However, this configuration has few advantages as shown by characteristic curve (a) of FIG. 11.

The novel MMIC oscillator comprises a varactor diode acting as a capacitor for coupling an external load to the microwave feedback amplifier element providing feedback amplification of microwave signals. The junction capacitance of the varactor diode varies according to the bias voltage applied to it. The varactor diode connects the feedback amplifier element with the external load through the variable junction capacitance. Therefore, the capacitance value of the load-coupling capacitor can be changed by adjusting the bias voltage. Thus, variation of the capacitance of the load-coupling capacitor caused by design errors or by variations of the conditions of the manufacturing process can be easily corrected when the device is in use. In consequence, the oscillator can always be operated with good oscillating characteristics without hindering integration of individual components and without increasing costs.

In one feature of the invention, the novel MMIC oscillator has a main coupling capacitor as the load-coupling capacitor connecting the microwave feedback amplifier element with the external load. The main capacitor for connecting the feedback amplifier element with the external load is formed on the MMIC substrate. In addition, auxiliary coupling capacitors are disposed close to the main capacitor on the substrate. The auxiliary capacitors are connected with the main capacitor by wire bonding or another method. Thereby, the variation of the capacitance of the load-coupling capacitor caused by design errors or variations of the conditions of the manufacturing process can be easily corrected when the device is being used. As a result, the oscillator can be operated with good characteristics at all times without hindering integration of individual components and without increasing costs.

What is claimed is:

1. An MMIC oscillator comprising:
 a feedback amplifier for amplifying microwave signals and producing an oscillation output signal;
 a varactor diode having a junction capacitance which varies according to a bias voltage applied to said diode coupling the oscillation output signal to an external load; and
 an external load comprising a high power output amplifier for amplifying the oscillation output signal and an optical transmission device for converting the oscillation output signal amplified by said high power output amplifier into an optical signal.

2. The MMIC oscillator of claim 1 wherein said feedback amplifier includes a gate and a source, a control signal is applied to said gate of said feedback amplifier, and the output signal is supplied from the source of said feedback amplifier to said external load.

3. The MMIC oscillator of claim 1 wherein said feedback amplifier includes a gate and a drain, a control signal is applied to said drain of said feedback amplifier, and the oscillation output signal is supplied from the drain of said feedback amplifier to said external load.

4. The MMIC oscillator of claim 1 wherein said feedback amplifier includes a source and a drain, a control signal is applied to said drain of said feedback amplifier, and the oscillation output signal is supplied from the source of said feedback amplifier to said external load.

5. The MMIC oscillator of claim 1 wherein said feedback amplifier includes a source, a drain, and a gate, a control signal is applied to said drain of said feedback amplifier, and the oscillation output signal is supplied from said drain of said feedback amplifier to said external load.

6. The MMIC oscillator of claim 1 wherein said feedback amplifier includes a source, a drain, and a gate, a control signal is applied to said drain of said feedback amplifier, and the oscillation output signal is supplied from said gate of said feedback amplifier to said external load.

7. An MMIC oscillator comprising:
 a substrate;
 a feedback amplifier for amplifying microwave signals and producing an oscillation output signal;
 a main coupling capacitor disposed on said substrate and capacitively coupling the oscillation output signal from said feedback amplifier to an external load; and
 a plurality of auxiliary coupling capacitors disposed close to said main coupling capacitor on said substrate for parallel connection with said main coupling capacitor for adjustment of the capacitance coupling the oscillation output signal from said feedback amplifier to the external load.

8. The MMIC oscillator of claim 7 wherein said main and at least one of said auxiliary coupling capacitors are connected in parallel by wires.

9. The MMIC oscillator of claim 8 including an external load wherein said external load comprises a high power amplifier for amplifying the oscillation output signal and an antenna for radiating the oscillation output signal amplified by said high power amplifier as electromagnetic waves.

10. The MMIC oscillator of claim 8 including an external load wherein said external load comprises a high power amplifier for amplifying the oscillation output signal and an optical transmission device for converting the signal amplified by said high power amplifier into an optical signal.

11. The MMIC oscillator of claim 9 wherein said feedback amplifier includes a gate and a source, a control signal is applied to said gate of said feedback amplifier, and the output signal is supplied from said source of said feedback amplifier to the external load.

12. The MMIC oscillator of claim 9 wherein said feedback amplifier includes a gate and a drain, a control signal is applied to said gate of said feedback amplifier, and the oscillation output signal is supplied from said drain of said feedback amplifier to said external load.

13. The MMIC oscillator of claim 9 wherein said feedback amplifier includes a source and a drain, a control signal is applied to said drain of said feedback amplifier, and the oscillation output signal is supplied from said source of said feedback amplifier to said external load.

14. The MMIC oscillator of claim 9 wherein said feedback amplifier includes a source, a drain, and a gate, a control signal is applied to said drain of said feedback amplifier, and the oscillation output signal is supplied from said drain of said feedback amplifier to the external load.

15. The MMIC oscillator of claim 9 wherein said feedback amplifier includes a source, a drain, and a gate, a control signal is applied to said drain of said feedback amplifier, and the oscillation output signal is supplied from said gate of said feedback amplifier to the external load.

* * * * *